US010395954B2

(12) United States Patent
Thanner

(10) Patent No.: US 10,395,954 B2
(45) Date of Patent: Aug. 27, 2019

(54) METHOD AND DEVICE FOR COATING A PRODUCT SUBSTRATE

(71) Applicant: EV Group E. Thallner GmbH, St. Florian am Inn (AT)

(72) Inventor: Christine Thanner, Dietersburg (DE)

(73) Assignee: EV Group E. Thallner GmbH, St. Florian am Inn (AT)

( * ) Notice: Subject to any disclaimer, the term of this patent is extended or adjusted under 35 U.S.C. 154(b) by 0 days.

(21) Appl. No.: 15/520,201

(22) PCT Filed: Nov. 5, 2014

(86) PCT No.: PCT/EP2014/073828
§ 371 (c)(1),
(2) Date: Apr. 19, 2017

(87) PCT Pub. No.: WO2016/070915
PCT Pub. Date: May 12, 2016

(65) Prior Publication Data

US 2017/0316965 A1 Nov. 2, 2017

(51) Int. Cl.
*H01L 21/67* (2006.01)
*B05B 7/12* (2006.01)
(Continued)

(52) U.S. Cl.
CPC ...... *H01L 21/67126* (2013.01); *B05B 7/1272* (2013.01); *B05B 7/1481* (2013.01); *B32B 37/08* (2013.01); *H01L 21/67132* (2013.01)

(58) Field of Classification Search
CPC ........... H01L 2221/68363; H01L 2221/68368; H01L 51/0013; H01L 21/67–67126;
(Continued)

(56) References Cited

U.S. PATENT DOCUMENTS 2,032,438 A * 3/1936 Riecken ................. A44B 19/28 24/430
3,990,142 A * 11/1976 Weglin ................... B21D 28/14 156/261
(Continued)

FOREIGN PATENT DOCUMENTS

EP 2 642 838 A1 9/2013 ............... H05K 3/20
JP H10-51108 A 2/1998 ............... H05K 3/20
(Continued)

OTHER PUBLICATIONS

International Search Report from corresponding International Patent Application No. PCT/EP2014/073828, dated Mar. 17, 2015.

*Primary Examiner* — Mary A Wilczewski
(74) *Attorney, Agent, or Firm* — Kusner & Jaffe

(57) ABSTRACT

A method and device for coating projecting surfaces of discrete projections of a product substrate that has functional units arranged at least partially in recesses. The method includes the steps of: bringing the projecting surfaces into contact with a coating material that is applied on a carrier substrate, and separating the carrier substrate from the projecting surfaces in such a way that the coating material remains partially on the product substrate. In addition, this invention relates to a corresponding device.

7 Claims, 4 Drawing Sheets

(51) Int. Cl.
*B05B 7/14* (2006.01)
*B32B 37/08* (2006.01)

(58) Field of Classification Search
CPC ....... H01L 21/67132; H01L 2224/8385; H01L 21/30; G03F 7/0002; B81C 2201/0147; B81C 1/00444–00492; B81C 1/00468–00484; B05B 7/1272; B05B 7/1481; B32B 37/08
See application file for complete search history.

(56) References Cited

U.S. PATENT DOCUMENTS

| | | | | | |
|---|---|---|---|---|---|
| 5,300,457 | A * | 4/1994 | Schiltz | H01L 21/568 | 257/E21.505 |
| 5,316,853 | A * | 5/1994 | Shibata | H01L 21/6836 | 257/E21.505 |
| 6,660,557 | B2 * | 12/2003 | Usami | G06K 19/07718 | 257/E23.064 |
| 6,753,614 | B2 * | 6/2004 | Yamazaki | C09J 7/02 | 257/704 |
| 6,924,211 | B2 * | 8/2005 | Yamazaki | C09J 7/02 | 257/E21.505 |
| 6,936,912 | B2 * | 8/2005 | Akiyama | H01L 21/6835 | 257/390 |
| 7,056,769 | B2 * | 6/2006 | Usami | G06K 19/07718 | 257/E23.064 |
| 7,244,662 | B2 * | 7/2007 | Kondo | H01L 21/2007 | 257/E21.122 |
| 7,407,839 | B2 * | 8/2008 | Akiyama | H01L 21/6835 | 257/E21.505 |
| 7,459,341 | B2 * | 12/2008 | Usami | G06K 19/07718 | 257/E21.499 |
| 7,585,703 | B2 * | 9/2009 | Matsumura | G02F 1/1362 | 257/E27.132 |
| 7,591,958 | B2 * | 9/2009 | Gardes | H01L 21/6835 | 216/79 |
| 7,612,438 | B2 * | 11/2009 | Akiyama | H01L 21/6835 | 257/390 |
| 7,930,822 | B2 * | 4/2011 | Nakanishi | H05K 3/046 | 156/233 |
| 8,162,231 | B2 * | 4/2012 | Ogata | G06K 19/07722 | 235/380 |
| 8,445,092 | B2 * | 5/2013 | Karasawa | C08G 18/6229 | 428/67 |
| 9,478,674 | B2 * | 10/2016 | Kumai | H05K 3/20 | |
| 2002/0016020 | A1 * | 2/2002 | Usami | G06K 19/07718 | 438/106 |
| 2002/0140063 | A1 * | 10/2002 | Yamazaki | H01L 21/6836 | 257/668 |
| 2002/0197554 | A1 * | 12/2002 | Wolk | B41M 3/006 | 430/200 |
| 2003/0011738 | A1 * | 1/2003 | Akiyama | H01L 21/6835 | 349/156 |
| 2003/0087476 | A1 * | 5/2003 | Oohata | G09F 9/33 | 438/108 |
| 2003/0140485 | A1 * | 7/2003 | Yamazaki | H01L 21/6836 | 29/740 |
| 2004/0036078 | A1 * | 2/2004 | Kondo | H01L 21/6835 | 257/80 |
| 2004/0063243 | A1 * | 4/2004 | Usami | G06K 19/07718 | 438/106 |
| 2004/0191491 | A1 * | 9/2004 | Sugaya | H05K 3/20 | 428/209 |
| 2005/0243229 | A1 * | 11/2005 | Akiyama | H01L 21/6835 | 349/42 |
| 2006/0001023 | A1 * | 1/2006 | Akiyama | H01L 21/6835 | 257/59 |
| 2006/0082002 | A1 * | 4/2006 | Arai | H05K 1/185 | 257/787 |
| 2006/0189040 | A1 * | 8/2006 | Usami | G06K 19/07718 | 438/125 |
| 2007/0166500 | A1 * | 7/2007 | Sutoh | H01L 21/67132 | 428/41.7 |
| 2009/0186450 | A1 | 7/2009 | Yeh | 438/118 | |
| 2009/0236026 | A1 * | 9/2009 | Tamaki | H01L 21/67132 | 156/64 |
| 2010/0035377 | A1 * | 2/2010 | Gobrogge | B29D 11/00865 | 438/99 |
| 2010/0099240 | A1 * | 4/2010 | Watanabe | C09J 7/385 | 438/464 |
| 2011/0048779 | A1 * | 3/2011 | Karasawa | C08G 18/6229 | 174/260 |
| 2015/0107764 | A1 * | 4/2015 | Katayama | C09J 7/02 | 156/248 |
| 2015/0217505 | A1 | 8/2015 | Fischer et al. | B29C 59/022 | |

FOREIGN PATENT DOCUMENTS

| | | | | |
|---|---|---|---|---|
| JP | H10-51108 A | 2/1998 | | |
| JP | H10-166794 A | 6/1998 | | |
| JP | H11-115394 A | 4/1999 | | |
| JP | 3085649 B2 | 9/2000 | B32B 15/08 | |
| JP | 2012-253275 A | 12/2012 | | |
| JP | 2014-011421 A | 1/2014 | | |
| WO | WO 2014/037044 A1 | 3/2014 | G03F 7/00 | |
| WO | WO 2015/197132 A1 | 12/2015 | H01L 21/67 | |

* cited by examiner

METHOD AND DEVICE FOR COATING A PRODUCT SUBSTRATE

FIELD OF INVENTION

The invention relates to a method and a device for coating a product substrate

BACKGROUND OF THE INVENTION

In the semiconductor industry, there exist various methods for applying very thin layers, in particular layers with mean thicknesses in the micrometer range, or even in the nanometer range, on surfaces. Frequently, direct coating methods that deposit a material on a surface are used. These include, for example, chemical and physical gas phase deposition, dipping methods, etc. These direct coating methods in general always coat the entire surface.

In the semiconductor industry, however, there are innumerable methods in which it is necessary to be sure not to coat the entire surface. In order to keep a coating from areas that are not to be coated, masking techniques, for example photolithography or imprint lithography, are still frequently used in the state of the art. In photo processes, however, the usual procedure is first to coat the entire surface of the wafer and then to structure it. In turn, this process therefore pertains to a complete coating of the surface, which is unacceptable for many applications. Many applications must not come into contact with the coating material at any point in time. In other applications, a brief contact with the coating material would be acceptable, but the removal of the same from the locations that are not to be coated represents a major problem. Thus, for example, structures with a large height-to-width ratio can produce a very strong capillary effect, which makes the removal of the coating material from the structures impossible. In addition, all types of masking techniques are very labor-intensive and costly, in particular since a relatively large number of process steps must be performed. An increasing number of process steps increases not only the costs, but also the susceptibility to errors.

Another approach in the semiconductor industry is the so-called microcontact printing (μCP). A technical problem lies in the fact that a μCP stamp must be adapted to transfer a material to the structures of the product wafers that are to be coated. For each new type of product wafer, a new stamp must be manufactured. In addition, the problem lies in the fact that in a first process step, a μCP stamp must be immersed in the material that is to be transferred or must be impregnated with the material from its rear side. Subsequently, an exact alignment of the μCP stamp is carried out relative to the raised structures of the product wafer. In another, third process step, the transfer of the material from the μCP stamp to the areas of the product wafer that are to be coated is carried out.

SUMMARY OF THE INVENTION

It is therefore an object of the present invention to provide a method and a device, with which the partial coating of product substrates can be achieved in an economical manner with as few as possible, preferably simple, process steps. The method and the device are to be as universally usable as possible and/or to have as high a throughput as possible.

This object is achieved in particular with the features of the independent claim(s). Advantageous further developments of the invention are indicated in the subclaims. All combinations of at least two of the features indicated in the specification, the claims, and/or the figures also fall within the scope of the invention. In the indicated ranges of values, values as boundary values that lie within the above-mentioned limits are also to be disclosed and can be claimed in any combination.

The invention is based on the idea of further developing a generic device or a generic method in that the coating material that is applied on a carrier substrate, in particular by bringing it into contact with the product substrate, is transferred only partially to the product substrate, in particular exclusively to the areas that are to be coated. This is achieved in particular in that when separating the carrier substrate, a portion of the coating material remains on the product substrate, specifically in particular exclusively on the areas that are to be coated.

The invention pertains in particular to coating a carrier substrate, in particular a carrier film, with any coating material, in particular a polymer, even more preferably BCB (benzocyclobutene), and using the product substrate, in particular a product wafer, with ridges, as a stamp and at the same time as an end product. To this end, the carrier substrate and the product substrate are brought into contact with one another, and by another process step, in particular a transfer of force by a roller, the coating material is transferred from the carrier substrate to the raised structures of the product substrate. In this process step, the product substrate thus acts almost as a stamp, but at the same time it is also the product substrate that is to be coated or the end product according to the invention.

The invention relates in particular to a method and a unit with whose help topographic product substrates (i.e., substrates that have raised structures) can be coated. In this case, the invention is based in particular on the idea of transferring the coating (or the coating material) to the projecting surfaces of the raised structures by a layer transfer process. Prior to that, the layer is applied to a carrier substrate, in particular a carrier film, and the carrier substrate is transferred by applying a force, in particular caused by a moving roller, from the carrier substrate, in particular at least predominantly, preferably exclusively, to the projecting surfaces.

The coating material is preferably a polymer, in particular BCB. The polymer, in particular BCB, is preferably necessary for bonding structured surfaces to a second object, in particular a second wafer, or to encapsulation units.

An advantage of the device according to the present invention and the method according to the present invention is that some process steps can be omitted or some process steps can be eliminated, which are necessary in the state of the art.

According to the invention, in particular one or more of the process steps mentioned below can be eliminated:

- Material receiving means on a stamp that is different in particular from the product substrate,
- Alignment processes, in particular with an accuracy that is higher than 500 μm, preferably higher than 100 μm, even more preferably higher than 1 μm, most preferably higher than 50 nm, and all the more preferably higher than 1 nm,
- Transfer processes from a stamp to a product substrate.

Instead, the production of the material layer is carried out according to the invention preferably on a carrier substrate, in particular a carrier film, and is to be produced in the simplest manner, in particular by means of a centrifugal enameling unit. The actual layer transfer process then takes place directly between this carrier film and the product substrate, specifically in particular without a single alignment step.

The Product Substrate

The method according to the invention is suitable for any type of substrate that has projections whose projecting surfaces have to be coated. In this case, the coating or enameling of the projecting surfaces is carried out according to the invention in particular by a layer transfer process. The layer transfer process prevents in particular the coating or enameling of the surfaces of the recesses corresponding to the projections. Two different product substrates are described, for which the method according to the invention is especially suitable.

In a first embodiment, the structured product substrate has a mean thickness t1 and multiple projections that surround functional units, in particular microsystems such as MEMS (microelectromechanical systems). The projections serve as cavity walls, whose projecting surfaces that run in particular in an aligned manner or in a plane are to be coated by the process according to the invention. In this first embodiment of the product substrate, the cavity walls are produced by different processes, in particular lithographic processes on the surface of the product substrate.

In a second embodiment, the structured product substrate has a mean thickness t1' and multiple recesses, in which the functional units, in particular microsystems such as MEMS, are embedded. The recesses are preferably etched directly in the product substrate. By the etching of the recesses, the cavity walls that surround the recesses are produced at the same time.

The Carrier Substrate

The form of the carrier substrates is arbitrary, whereby the peripheral contour is in particular rectangular or square. The side lengths of such rectangular carrier substrates are in particular greater than 10 mm, preferably greater than 50 mm, even more preferably greater than 200 mm, and most preferably greater than 300 mm. In particular, the side lengths are always greater than the characteristic geometric size of the substrate. The peripheral contour of the carrier substrates can also be circular. The diameter of such circular carrier substrates is in particular industrially standardized. The carrier substrates therefore preferably have a diameter of 1 inch, 2 inches, 3 inches, 4 inches, 5 inches, 6 inches, 8 inches, 12 inches and 18 inches. In special embodiments, the carrier substrate can be in particular a coiled-up film that can be tensioned in a laminating device. Then, it is almost a "continuous film."

In a first embodiment according to the invention, the carrier substrate is a carrier film. The characteristic property of the carrier film is its bendability. Bendability is best indicated by the (axial) modulus of resistance. Assuming a rectangular cross-section with width b and thickness t2, the modulus of resistance depends on the square of the thickness t2. Thus, the smaller the thickness t2, the smaller the modulus of resistance and the smaller the (geometric) resistance. The carrier substrates according to the invention have in particular a thickness t2 that is smaller than 1,000 μm, preferably less than 500 μm, even more preferably less than 100 μm, most preferably less than 50 μm, and all the more preferably less than 10 μm. The carrier films can either be attached or lie flat on a flat support, in particular on the specimen holder, on which the deposition of the material is also carried out. Stretching the carrier film onto a frame is also conceivable.

In a second embodiment according to the invention, the carrier substrate is a carrier wafer, in particular made of silicon or glass. The carrier wafer is preferably thinned to a thickness t2, at which it can be bent and shaped. The carrier wafers according to the invention preferably have a thickness t2 that is smaller than 1,000 μm, preferably less than 500 μm, even more preferably less than 250 μm, most preferably less than 100 μm, and even more preferably less than 50 μm. Such carrier substrates do not have the same flexibility as carrier films but are more elastic and can thus be better returned to their original shape.

Before the coating or enameling with the coating material that is to be transferred according to the invention, the carrier substrate is prepared in particular in such a way that the material that remains after the layer transfer process can be removed again from the carrier substrate as easily as possible in order to bring the carrier substrate to a new coating process. In particular, the surface of the carrier substrate is modified in such a way that the adhesion between the material and the carrier substrate surface is minimal. The adhesion is preferably defined via the energy per unit of surface area, which is necessary to separate from one another two surfaces that are connected to one another. In this case, the energy is indicated in $J/m^2$. The energy per unit of surface area, between the carrier substrate and the coating material, is in particular less than 2.5 $J/m^2$, preferably less than 2.0 $J/m^2$, more preferably less than 1.5 $J/m^2$, most preferably less than 1.0 $J/m^2$, with utmost preference less than 0.5 $J/m^2$, and even more preferably less than 0.1 $J/m^2$.

According to a preferred embodiment according to the invention, the adhesion between the coating material and the carrier substrate is low so that the coating material is smoothed again by its own cohesion (self-healing or self-smoothing), so that multiple removal processes of the coating material on multiple product substrates are possible. As a result, the carrier substrate at least does not have to be cleaned and recoated each time. This can be supported in particular by thermal and/or electrical and/or magnetic stressing of the coating material after the separation. For this purpose, in particular the viscosity is reduced in order to provide a high enough cohesion to ensure self-smoothing of the material at moderate temperatures. The temperature is selected in particular less than 500° C., preferably less than 250° C., even more preferably less than 100° C., and most preferably less than 50° C.; even more preferably, a self-smoothing takes place at room temperature. The temperature is in particular more than 15° C.

The Process (Method)

In a first process step according to the invention, a carrier substrate that is designed as described above is prepared for a coating or enameling. The carrier substrate is attached to a specimen holder. The specimen holder has attaching means. The attaching means can be in particular vacuum strips; porous elements that are manufactured in particular from ceramic, that can be subjected to a vacuum; and that build up underpressure; mechanical clamps, electrostatic elements; magnetic elements, or, in particular, switchable adhesive elements.

If a vacuum specimen holder is used, the latter is preferably designed in such a way that enough negative pressure can be produced to ensure a strong attachment of the carrier substrate by the structured specimen holder. The absolute pressure within the vacuum specimen holder is in particular less than 1 bar, preferably less than $7.5*10^{-1}$ mbar, even more preferably less than $5.0*10^{-1}$ mbar, most preferably less than $2.5*10^{-1}$ mbar, and all the more preferably less than. $1*10^{-1}$ mbar. The specimen holder can preferably be heated and/or cooled, in particular to temperatures of above 25° C., preferably above 50° C., even more preferably above 100° C., most preferably above 250° C., and all the more preferably above 500° C. The specimen holder can be designed in a coolable manner or can have cooling means. The specimen holder can in particular to temperatures of below 25° C., preferably below 0° C., even more preferably below −25° C., most preferably below −75° C., and all the more preferably below −125° C. Corresponding cooling is suitable primarily when the coating material that is to be transferred is more easily dissolved from the carrier substrate by cold embrittlement. PCT/EP 2014/063687 describes a method in which such embrittlement mechanisms are disclosed and to which reference is made in this respect. The cooling device of the specimen holder can also be used for more efficient, faster, and primarily more exactly controlled reduction of the elevated temperature of the heated specimen holder. The specimen holders can be used for attaching the carrier substrate and/or the structured specimen holder.

The carrier substrate can be used in particular several times, in particular in connection with cleaning before renewed enameling or coating. The cleaning is preferably done with a cleaning chemical that is suitable for this purpose. The cleaning chemical should preferably have chemical properties that completely remove residues of the material that is to be transferred, without attacking the carrier substrate chemically. As a cleaning chemical, in particular one or more of those below is/are selected:

- Water, in particular distilled water, and/or
- Solvents, in particular lemon-containing solvents and/or acetone and/or PGMEA and/or isopropanol and/or mesitylene and/or
- Acids and/or
- Lye.

The carrier substrate can, in particular in addition, be cleaned physically by compressed air or special cleaning gases in order to remove particles.

If the surface of the carrier substrate was to be prepared accordingly, so that the adhesion between the material and the carrier substrate is minimal, cleaning is all the simpler. Preferably, then, the use of distilled water is already sufficient to flush away the material and the contaminants. In particular, a cleaning chemistry that does not attack the surface is selected.

In a second process step according to the invention, the coating or enameling of the carrier substrate is carried out. The coating or enameling of the carrier substrate is preferably carried out by a centrifugal enameling process. Spray-enameling processes, laminating processes and/or dipping processes would also be conceivable. In quite special embodiments according to the invention, in particular when the carrier substrate was used only one time, the carrier substrates can already be coated with the material that is to be transferred. This is primarily the case with films. The coating of the film can in this case be carried out by means of spray-enameling, centrifugal enameling, extrusion or dip-coating.

The layer thickness homogeneity after the coating, in particular a TTV value (English: total thickness variation) of the coating material, is in particular less than 10 μm, preferably less than 1 μm, even more preferably less than 100 nm, most preferably less than 10 nm, and all the more preferably less than 1 nm. The layer thickness homogeneity of the material that is to be transferred is described by the TTV value. This refers to the difference between the largest and the smallest measured layer thickness on the surface that is to be measured (coating surface).

According to the invention, all types of coating materials can be used for the coating or enameling. In a preferred embodiment, a permanent bonding adhesive, in particular BCB, is used. Other coating materials that are conceivable according to the invention are:

- Polymers, in particular bonding adhesives, preferably
  - Temporary bonding adhesives, even more preferably HT10.10, and/or
  - Permanent bonding adhesives, in particular benzocyclobutene (BCB) and/or
  - JSR WPR 5100 and/or SU-8 and/or optical adhesives and/or polyimide-based adhesives, and/or
- Metals, in particular Au, Ag, Cu, Al, Fe, Ge, As, Sn, Zn, Pt and/or W.

According to the invention, permanent bonding adhesives are preferably used. A permanent bonding adhesive is understood to be a polymer that is used for permanent bonding. The permanent bonding is carried out by a cross-linking of the bonding adhesive, in particular by heat and/or electromagnetic radiation, in particular UV light.

The applied coating material is preferably thermally treated after the coating or enameling on the carrier substrate in order to expel solvent. The temperature for expelling solvent is in particular greater than 25° C., preferably greater than 50° C., even more preferably greater than 75° C., most preferably greater than 100° C., all the more preferably greater than 125° C. and/or less than 500° C., preferably less than 250° C.

In a third process step according to the invention, a rough adjustment of the carrier film is carried out relative to the product substrate. It is a decisive advantage according to the invention that the use of alignment units or a fine adjustment can be completely eliminated. The material that is to be transferred is present on the carrier substrate over the entire surface. The projections of the structured product substrate that are to be coated always come into contact—in approaching the carrier substrate and thus the coating material—with an area of the carrier substrate surface that is coated with the coating material. The structured product substrate is thus to form a stamp provided with projections.

The difference between a rough adjustment and an alignment or fine adjustment lies in the maximum alignment accuracy of the adjustment system that is used. According to the invention, the latter is in particular a maximum of 1μm, preferably a maximum of 100 μm, even more preferably a maximum of 500 μm, even more preferably a maximum of 1 mm μm , and most preferably a maximum of 2 mm. With the process according to the invention, i.e., preferably an alignment of the product substrate relative to the carrier substrate can be carried out using a robot, or, in the case of manual handling, by eye, without having to resort to complicated technical aids such as optics or software.

In a fourth process step according to the invention, an in particular uniform and immediate contact between the coating material and the projecting surface that is to be coated is made by contacting means, in particular a laminating device.

According to a first embodiment according to the invention, a material transfer is produced exclusively by contact of the surface with the coating material.

In another embodiment according to the invention, the material transfer is produced or at least accelerated by a force, in particular a surface force that is applied over the entire carrier substrate/product substrate, a surface force that is concentrated on a small surface of the carrier substrate/product substrate, a line force or a point force. The applied force is in particular less than 10 kN, preferably less than 1,000 N, even more preferably less than 100 N, most preferably less than 10 N, and all the more preferably less than 1 N. The calculation of the pressures that arise is accordingly derived by the division of the force by the surface or line. Accordingly, surface pressure and line pressure exist. in the case of a full-surface loading of a radially symmetrical, i.e., circular, product substrate of approximately 200 mm in diameter, a pressure of approximately 31.8 $kN/m^2$ or approximately 3.18 bar is produced in the case of an applied force of 10 kN bearing on its entire surface, and a pressure of approximately 31.8 $N/m^2$ or approximately 0.318 mbar is produced for an applied force of 1 N bearing on its entire surface. The applied pressure is therefore preferably between 4 bar and 0.3 mbar.

According to another embodiment of the invention, the application of a force is carried out on the carrier substrate side and/or the product substrate side (in particular on the side that faces away from the contact) by an in particular linear, progressive force transfer means, in particular a roller. The force transfer means is moved in particular at a feed rate v of less than 100 mm/s, preferably less than 50 mm/s, even more preferably less than 20 mm/s, most preferably less than 10 mm/s, and all the more preferably less than 1.0 mm/s. In this case, the pressing force is in particular less than 10 kN, preferably less than 1,000 N, even more preferably less than 100 N, most preferably less than 10 N, and all the more preferably less than 1 N. The pressing force acts in particular along a contact line L that runs crosswise to the feeding motion. The pressing pressure can be indicated in N/mm. In the case of an assumed carrier and product substrate diameter of 200 mm, a pressing line pressure of less than 50 kN/m, preferably less than 5,000 N/m, even more preferably less than 500 N/m, most preferably less than 50 N/m, and all the more preferably less than 5 N/m. would be produced in the case of the above-mentioned force in a position in the center of the two substrates. A device that would be suitable for carrying out the process according to the invention is disclosed in the publication WO2014/037044A1, to which reference is made in this respect.

The temperature during the application of a force is less than 500° C., preferably less than 300° C., even more preferably less than 150° C., most preferably less than 50° C., and all the more preferably, in particular without heating or cooling, room temperature. In the case of the coating with polymers according to the invention, the temperature during the application of a force preferably lies above the glass transition temperature of the polymer.

The force that is to be applied or the pressure that is to be applied is preferably selected in such a way that the carrier substrate does not bend significantly, and the coating material is not deposited in the recesses, but rather only on the projecting surfaces.

The contact time is in particular less than 60 s, preferably less than 30 s, even more preferably less than 25 s, most preferably less than 10 s, and all the more preferably less than 2 s. When using a surface force that is concentrated on a small surface, a line force or a point force, the contact time is defined as the dwell time of the force transfer means on the small surface, the line, or the point.

In another process step according to the invention, the separation of the structured product substrate from the carrier substrate is carried out by separating means, in particular a delaminating device.

According to a first variant, the separation is carried out by stripping or delaminating the carrier substrate from the structured product substrate. Delamination by stripping is especially then possible and useful when the carrier substrate is a carrier film that adheres too strongly to the surfaces of the projections of the structured product substrate because of an application of force. As a result, a partial separation of the carrier film from the structured product substrate in steps is made possible specifically from the surfaces of the projections.

According to a second variant of the separating method, the separation is carried out by a simple, relative removal (in particular without deformation) of the carrier substrate from the structured product substrate (or vice versa). For such a removal, normal forces, in particular normal surface forces, are applied, which preferably are applied in such a way that neither the carrier substrate nor the structured product substrate is deformed during lifting. Therefore, the two substrates are preferably attached over the entire surface to a corresponding specimen holder, in particular a vacuum specimen holder.

The temperature during the separation is in particular less than 500° C., preferably less than 300° C., even more preferably less than 150° C., most preferably less than 50° C., and all the more preferably room temperature, in particular without heating or cooling. In the case of the coating with polymers according to the invention, the temperature during the separation preferably lies below the glass transition temperature of the polymer.

After the separation, the coating material remains at least partially, preferably predominantly, on the surface projections of the product substrate.

In another process step according to the invention, an encapsulation can then be carried out. A covering, in particular another substrate (in particular a wafer) is pressed b , corresponding devices, in particular wafer bonders or chip-to-wafer bonders, on the coating material. After the bonding process, a hardening process of the coating material can still be carried out. The hardening process is preferably a thermal and/or electromagnetic hardening process. In the case of a thermal hardening, the temperature is in particular greater than 50° C., preferably greater than 100° C., even more preferably greater than 150° C., most preferably greater than 200° C., and all the more preferably greater than 250° C. In the case of a hardening by electromagnetic radiation, in particular by UV light, the electromagnetic radiation has in particular a wavelength in the range of between 10 nm and 2,000 nm, preferably between 10 nm and 1,500 nm, more preferably between 10 nm and 1,000 nm, with utmost preference between 10 nm and 500 nm, and with utmost preference between 10 nm and 400 nm.

Unit (Device)

In a first embodiment according to the invention, a unit according to the invention comprises at least

- Another device or another module for bringing the carrier substrate into contact with the structured product substrate, in particular for stressing the carrier substrate with a roller, even more preferably a laminating device for laminating the film, and
- A device or a module for removing the carrier substrate from the structured product substrate, in particular a delaminating device.

For the embodiment according to the invention, a device or a module for coating or enameling the carrier substrate, in particular a centrifugal enameling device, would optionally also be provided. Such a module can be eliminated in the embodiment according to the invention, however, if the carrier substrates are already coated beforehand by other devices or units.

The three above-mentioned devices can be parts of an individual module or separate modules that are compatible with one another and that can be used subsequently either individually or as part of a cluster. It is also conceivable that each of the three above-mentioned devices is present in a separate module in each case, and the process according to the invention is carried out along the process chain of the module.

Other advantages, features and details of the invention follow from the subsequent description of preferred embodiments and based on the drawings.

BRIEF DESCRIPTION OF THE DRAWINGS

In the figures, the same components and components with the same function or components in different processing states are identified with the same reference numbers.

DETAILED DESCRIPTION OF THE INVENTION

Figure 1A:
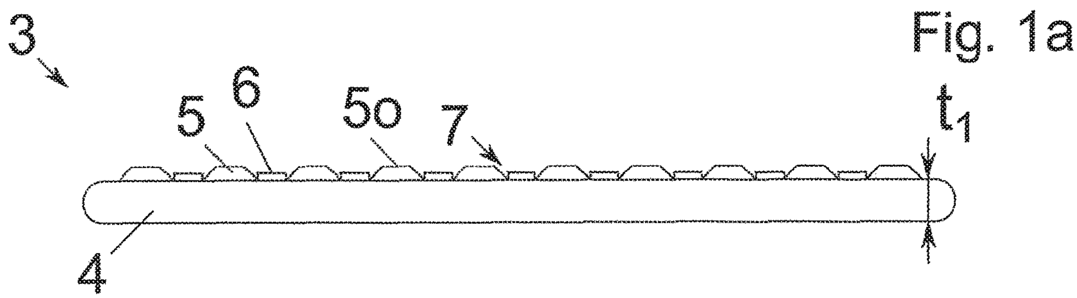
FIG. 1*a* a diagrammatic side view, not to scale, of a first embodiment of a structured product substrate according to the invention, FIG. 1*b* a diagrammatic side view, not to scale, of a second embodiment of the structured product substrate, FIGS. 2*a* to 2*g* diagrammatic side views, not to scale, of process steps of an embodiment of a method according to the invention, FIG. 3*a* a diagrammatic side view, not to scale, of a first end product (packaging of functional units), FIG. 3*b* a diagrammatic side view, not to scale, of a second end product (packaging of functional units), and FIG. 4 a diagrammatic sketch of an embodiment of a device according to the invention.

FIG. 1*a* shows a diagrammatic side view, not to scale, of a product substrate 3, comprising:

- A wafer 4, on which several projections 5 are formed,
- Functional units 6, which are to be encapsulated, are arranged between the projections 5.

The wafer 4 has a mean thickness t1. The entire thickness of the structured product substrate 3 is consequently greater than t1.

Figure 1B:
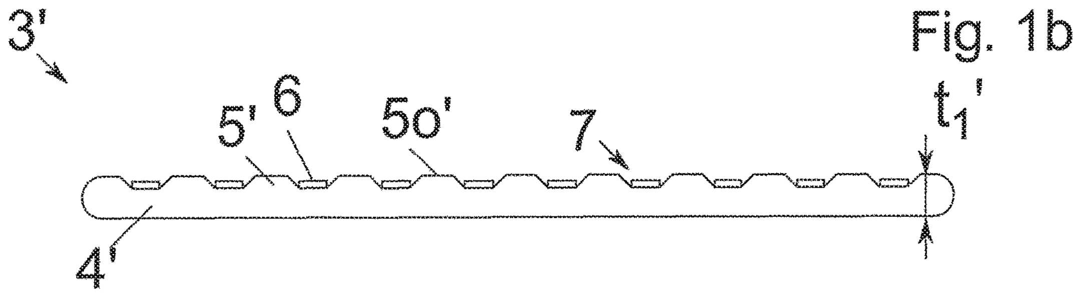

FIG. 1*b* shows a diagrammatic side view, not to scale, of a structured product substrate 3', comprising:

- A wafer 4', produced in particular by etching, with multiple projections 5, which are created by the etching of recesses 7,
- The functional units 6, which are to be encapsulated, are arranged between the projections 5, i.e., in the recesses 7.

The wafer 4' has a mean thickness t1'. In this embodiment, the total thickness of the structured product substrate 3' is in particular equal to the thickness t1'.

Figure 2A:
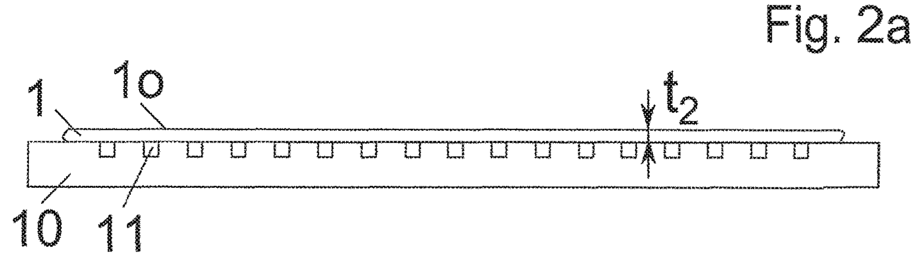

The first process step of the carrier substrate preparation according to the invention is depicted in FIG. 2*a*. In this case, a carrier substrate 1 is laid down on or attached to a specimen holder 10 with a side that faces away from a carrier substrate surface 1*o*. The attachment is made by attaching means 11, in particular vacuum strips, on which a vacuum can be applied. Also conceivable are electrostatic, electric, adhesive, magnetic or mechanical attachments, which ensure that the carrier substrate 1 is attached relative to the specimen holder 10 and remains attached.

In this case, the carrier substrate 1 is a carrier film. In the first process step, cleaning of the carrier substrate surface 1*o* can be carried out. This is primarily necessary when the carrier substrate surface 1*o* was already coated in a preceding process step with a coating material 2 and is now to be reused.

Figure 2B:
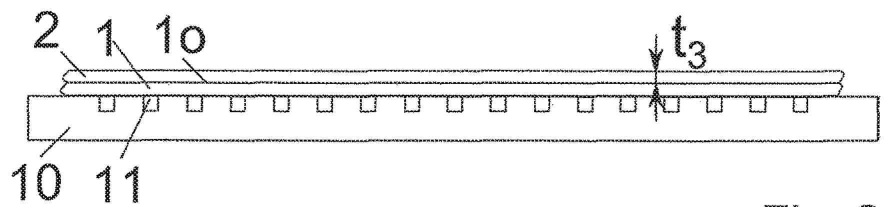

FIG. 2*b* shows a second process step according to the invention, in which a coating material 2 is deposited on the carrier substrate surface 1*o*. The deposition is carried out preferably in a centrifugal enameling unit, as an alternative in a spray-enameling unit. A material layer thickness t3 can be set very precisely and lies preferably in the micrometer range or even more preferably in the nanometer range.

Figure 2C:
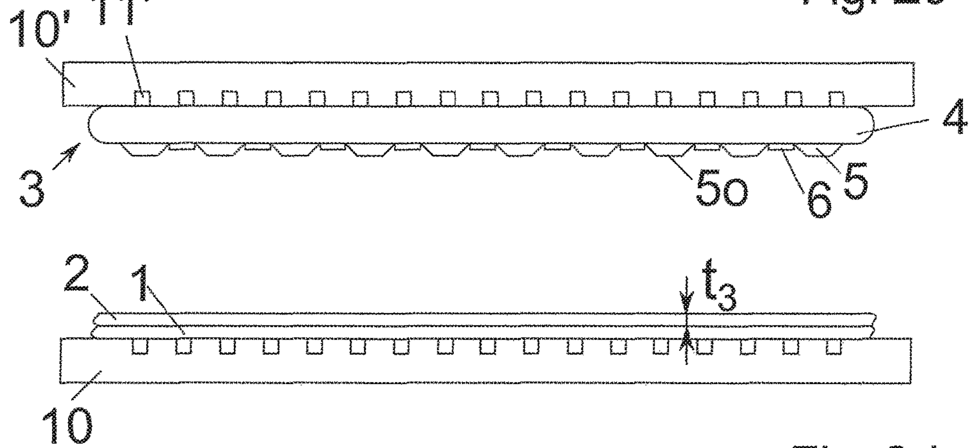

In a third process step according to the invention in accordance with FIG. 2*c*, a rough adjustment of the structured product substrate 3 is carried out, including the wafer 4 with ridges 5 in relation to the carrier substrate 1 that is prepared with the coating material 2. In this case, the structured product substrate 3 is also attached by attaching means 11' from a specimen holder 10'. An exact adjustment of the structured specimen holder 3 relative to the carrier substrate 1 is not necessary, since projecting surfaces 5*o* of the projections 5 are located at each position via a part of the coating material 2 and come into contact with the latter in the case of subsequent contact.

Figure 2D:
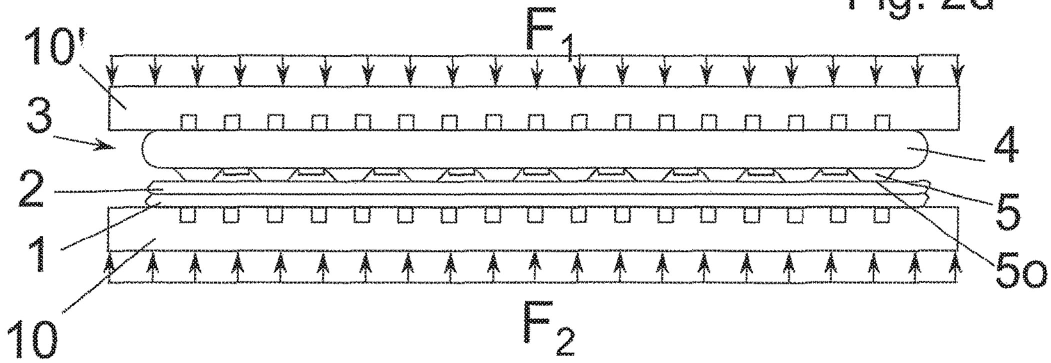

In the subsequent figures, the carrier substrate 1 is always shown on the bottom on its specimen holder 10, although in the implementation of the process according to the invention, a laying-down or lamination of the carrier substrate 1, in particular a carrier film, on the structured product substrate 3 is preferable. In addition, it is disclosed that the specimen holder 10, to which the carrier substrate 1 is attached, is in particular an attaching system of a laminating device, which attaches, in particular tensions, the carrier substrate 1, in particular a carrier film, so that it can be laminated on the structured product substrate 3 that is to be coated. Thus, the carrier substrate 1 does not rest on the full surface.

in a fourth process step according to the invention in accordance with FIG. 2*d*, the projecting surfaces 5*o* make contact with the coating material 2. In this process step, the structured product substrate 3 can be considered as a type of stamp. The transfer of the coating material 2 to the projecting surfaces 5*o* is preferably promoted, enhanced, or even first made possible by a force, in particular a surface force F.

Figure 2E:
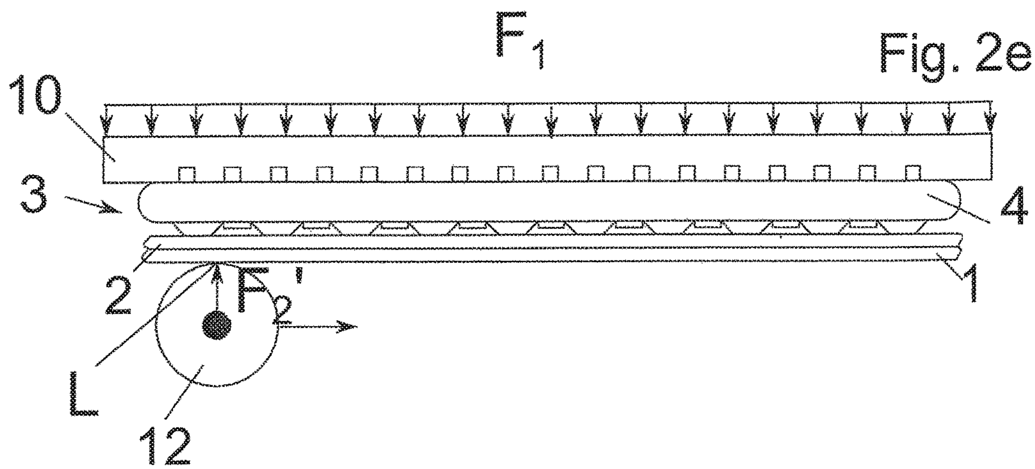

In a special, in particular alternative or additional, process step according to the invention in accordance with FIG. 2*e*, a more optimal material transfer is carried out by the application of a moving force transfer means 12, in particular a roller. The force transfer means 12 in this case exerts a force F, in particular a line force, on a rear side of the carrier substrate 1, in particular a carrier film, and thus promotes the material transfer from the carrier substrate 1 to the projecting surfaces 5*o*. The process step according to the invention in accordance with FIG. 2*e* can be combined with the process step according to the invention in accordance with FIG. 2*d* if the specimen holder 10, which is attached to the carrier substrate 1, is elastic enough to allow the force transfer of the force transfer means 12.

Figure 2F:
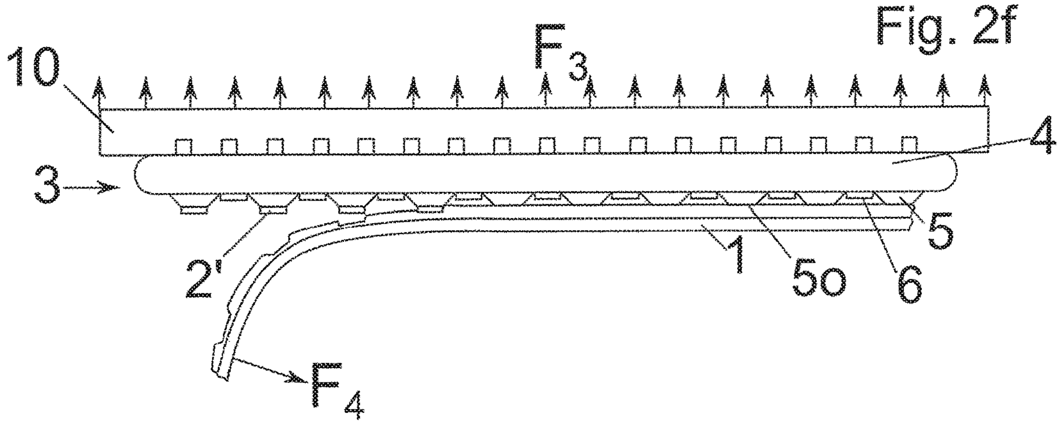

In a first separation step according to the invention in accordance with FIG. 2*f*, the carrier substrate 1, in particular a carrier film, is stripped from the projecting surfaces 5*o*. The stripping begins with one or more, in particular peripherally placed, spots. The stripping is therefore in particular not full-surface.

Figure 2G:
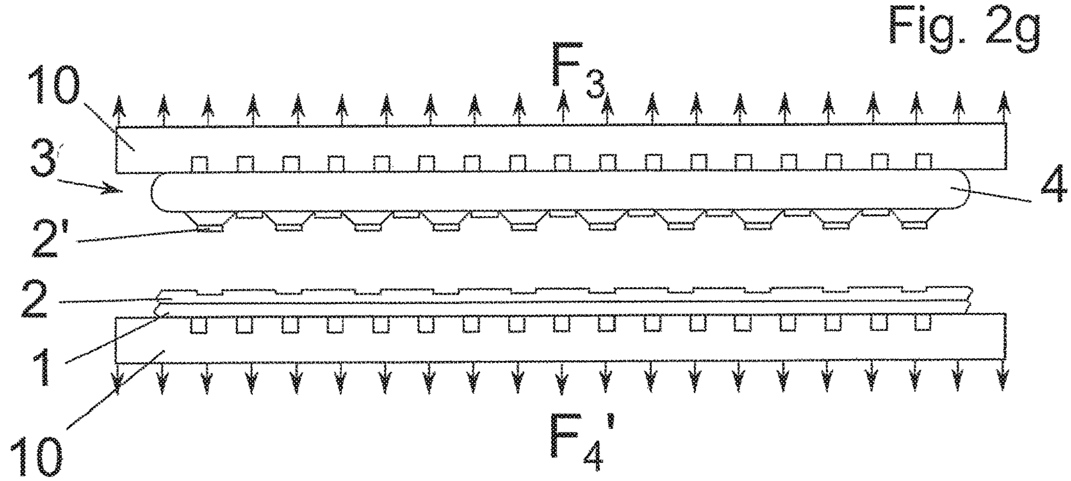

In a second alternative separation step according to the invention in accordance with FIG. 2*g*, the carrier substrate 1 and the structured product substrate 3 are removed from one another by normal forces, in particular surface forces.

Figure 3A:
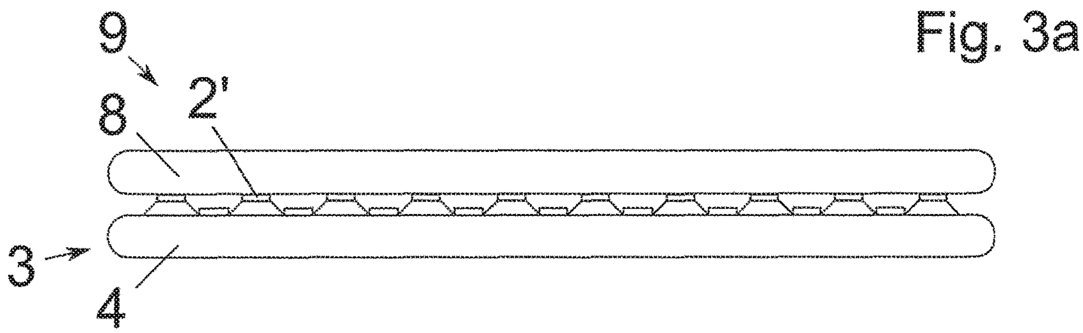
Figure 3B:
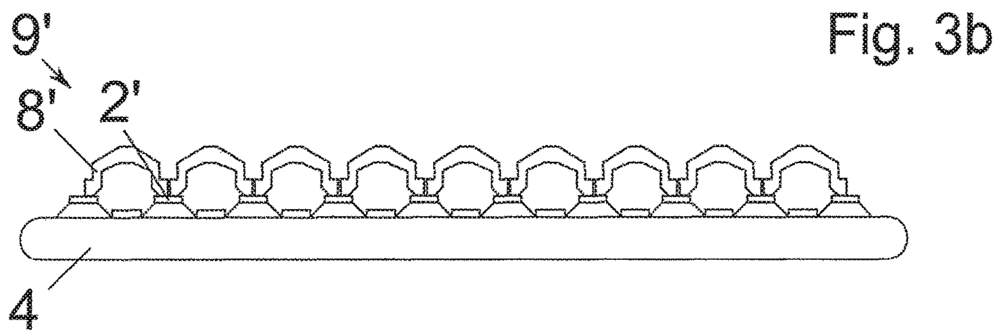

FIGS. 3*a* and 3*b* show two possible encapulations of the structured product substrates 3, 3' in end products 9, 9' (packaging of functional units).

In the embodiment according to FIG. 3*a*, the encapsulation is carried out by the bonding of a cover 8 in the form of a wafer to the coating material 2' that is transferred according to the invention.

In the embodiment according to FIG. 3*b*, an end product 9' is shown, in which the encapsulation is carried out by individual covers 8'. The individual covers 8' can be positioned and bonded by, for example, a chip-to-wafer bonder.

Figure 4:
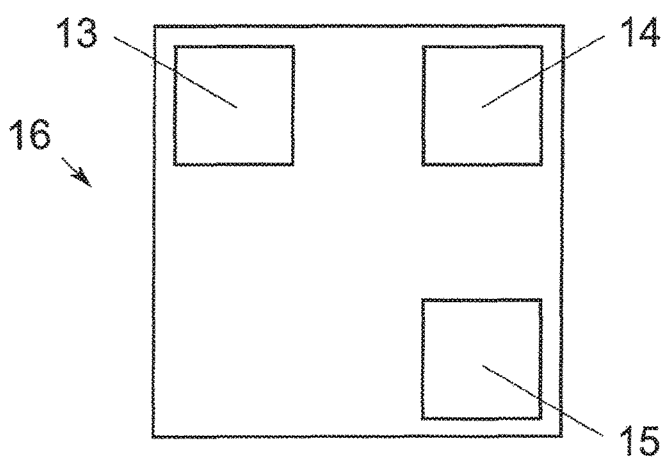

FIG. 4 shows a diagrammatic sketch of a unit 16 according to the invention, which comprises a coating device 13, a laminating device 14 (contacting means), and a delaminating device 15 (separating means), A laminating device 14 is understood in this connection as any device that is able to perform a layer transfer according to the invention of the coating material 2, 2' from a carrier substrate 1 to the projecting surfaces 5*o*. In particular, this refers to a conventional laminating device. The use of a bonder, in particular a wafer bonder, which brings the carrier substrate 1 up by approaching the structured product substrate 3, would also be conceivable, however.

A delaminating device 15 is understood in this connection to be any device that is able to perform a removal, according to the invention, of the carrier substrate 2 from the structured product substrate 3, in particular the projecting surfaces 5*o*. In particular, this refers to a conventional delaminating, device.

Some laminating devices 14 can also be used at the same time as delaminating devices 15.

A robot system, wafer cassettes, in particular FOUPS or all other necessary components that are required for handling, manipulation, or for loading or unloading the necessary substrates are not depicted.

LIST OF REFERENCE SYMBOLS

1 Carrier substrate
2, 2' Coating material
3, 3' Product substrate
4, 4' Wafer
5, 5' Projections
5*o*, 5*o*' Projecting surfaces
6 Functional units
7 Recesses
8, 8' Cover
9 End product
10, 10' Specimen holder
11, 11' Attaching means
12 Force transfer means
13 Coating device
14 Laminating device
15 Delaminating device
16 Unit Having described the invention, the following is claimed:

1. A method for coating a substrate surface, the method comprising:

providing a product substrate including (i) a plurality of projections having respective projecting surfaces and (ii) a plurality of recesses that are located between the plurality of projections, wherein functional units are at least partially arranged in the plurality of recesses, said functional units including at least one of a microelectronic system or a micromechanical system, providing a carrier substrate with a coating material applied to a surface thereof, contacting the projecting surfaces of the product substrate with the coating material applied to the surface of the carrier substrate, applying a force load to transfer a portion of the coating material from the surface of the carrier substrate to the projecting surfaces of the product substrate, wherein said force load includes a first force applied to a side of the carrier substrate facing away from the projecting surfaces, said force load applied after and/or during the contacting of the projecting surfaces with the coating material, and separating the carrier substrate from the product substrate such that the portion of the coating material transferred to the product substrate remains at least partially on the projecting surfaces, wherein separating the carrier substrate from the product substrate includes successively stripping the carrier substrate from the plurality of projections.

2. The method according to claim 1, wherein, after separating the carrier substrate from the product substrate, the portion of the coating material transferred to the product substrate remains predominantly on the projecting surfaces.

3. The method according to claim 1, wherein, after separating the carrier substrate from the product substrate, the portion of the coating material transferred to the product substrate remains exclusively on the projecting surfaces.

4. The method according to claim 1, wherein portions of each of the functional units arranged in the plurality of recesses are not exposed to the coating material.

5. The method according to claim 1, wherein the carrier substrate is a flexible carrier film.

6. The method according to claim 1, wherein the force load includes a second force that is applied in a direction opposite to a direction of the first force.

7. The method according to claim 1, wherein the method further comprises encapsulating the functional units after separating the carrier substrate from the product substrate, said encapsulating including bonding at least one cover to the coating material on the projecting surfaces of the plurality of projections.

* * * * *